United States Patent [19]
Jekal

[11] Patent Number: 6,035,428
[45] Date of Patent: Mar. 7, 2000

[54] APPARATUS FOR DEINTERLEAVING AND OUTPUT-PROCESSING DECODED DATA IN A TRELLIS DECODER

[75] Inventor: Heon Jekal, Seoul, Rep. of Korea

[73] Assignee: Daewoo Electronics Co. Ltd., Rep. of Korea

[21] Appl. No.: 09/052,550

[22] Filed: Mar. 31, 1998

[30] Foreign Application Priority Data

Mar. 31, 1997 [KR] Rep. of Korea .................. 97-11850

[51] Int. Cl.[7] ................................. H03M 13/22
[52] U.S. Cl. .................. 714/702; 714/788; 714/792
[58] Field of Search .................. 714/702, 788, 714/792

[56] References Cited

U.S. PATENT DOCUMENTS

| | | | |
|---|---|---|---|
| 5,398,073 | 3/1995 | Wei | 348/487 |
| 5,430,767 | 7/1995 | Min | 375/340 |
| 5,497,205 | 3/1996 | Yang et al. | 348/737 |
| 5,508,752 | 4/1996 | Kim et al. | 348/608 |
| 5,512,957 | 4/1996 | Hulyalkar | 348/607 |
| 5,583,889 | 12/1996 | Citta et al. | 375/341 |
| 5,631,645 | 5/1997 | Fimoff | 341/100 |
| 5,646,698 | 7/1997 | Yang et al. | 348/475 |
| 5,648,822 | 7/1997 | Hulyalkar | 348/607 |

FOREIGN PATENT DOCUMENTS

| | | |
|---|---|---|
| 0552979 | 7/1993 | European Pat. Off. . |
| 9705702 | 2/1997 | WIPO . |

Primary Examiner—Stephen M. Baker
Attorney, Agent, or Firm—Anderson Kill & Olick

[57] ABSTRACT

An apparatus deinterleaves decoded symbols and outputs the deinterleaved symbols in an appropriate form for external devices. In order to achieve the deinterleaving and outputting processes, the apparatus sequentially stores the decoded symbols in response to enable signals and produces output data of P bits based on the stored decoded symbols by using two memory groups which alternately perform the storing and the producing processes. The operations of the two memory groups are controlled by an input control block and an output control block. The input control block produces the enable signals to control the two memory groups to thereby sequentially store the decoded symbols to the two memory groups. The output control block selects one of outputs provided from the two memory groups and provides the selected output as the output data of P bits.

7 Claims, 7 Drawing Sheets

APPARATUS FOR DEINTERLEAVING AND OUTPUT-PROCESSING DECODED DATA IN A TRELLIS DECODER

FIELD OF THE INVENTION

The present invention relates to a trellis decoder; and, more particularly, to an apparatus capable of deinterleaving and output-processing decoded data in the trellis decoder in an effective manner.

DESCRIPTION OF THE PRIOR ART

Recently, there has been increasing interest in some types of combined modulation and coding schemes, called trellis-coded modulation(TCM), that achieve coding gain without any bandwidth expansion in a bandwidth-limited channel. The TCM includes a finite-state encoder and a non-binary modulator. Therefore, as compared with a conventional modulation, the TCM can achieve net coding gains of 3 to 6 dB, relative to uncoded case, in the presence of an additive white gaussian noise(AWGN).

In a concatenated coding technique implementing a concatenated coding by connecting two different coders, e.g., an inner and an outer coders, so as to advance data reliability, a well known convolutional encoder or a TCM encoder is used as the inner coder and data encoded by the inner coder are decoded by a decoder employing a Viterbi algorithm. A Reed-Solomon coder can be used as the outer coder. The outer coder corrects errors which have not been corrected at the inner coder to thereby minimize the rate of errors. This concatenated coding technique achieves more advanced implementation with less complex hardware than a coding technique having one coding method.

At a receiving end, the TCM data are decoded through the use of a trellis decoder. The trellis decoder is a maximum likelihood decoder that provides a forward error correction. Trellis decoding is used in decoding a sequence of encoded symbols, such as a bit stream. The bit stream can represent encoded information in telecommunication transmission through various media with each set of bits representing a symbol instant. In the decoding process, the trellis decoder works back through a sequence of possible bit sequences at each symbol instant to determine which bit sequence could most likely have been transmitted. The possible transitions from a bit at one symbol instant, or state, to a bit at a next, subsequent, symbol instant or state is limited. Each possible transition from one state to a next state can be shown graphically and defined as a branch. A sequence of interconnected branches defines a path. Each state can transit only to a limited number of next states upon receiving a next bit in the bit stream. Thus, some paths survive during the decoding process and the other paths do not. By eliminating those transition paths that are not permissible, computational efficiency can be improved in determining those paths most likely to survive. The trellis decoder typically defines and calculates a branch metric associated with each branch and employs this branch metric to determine which paths will survive and which paths will not.

A branch metric is calculated at each symbol instant for each possible branch. Each path has an associated metric, an accumulated value, that is updated at each symbol instant. For each possible transition, the accumulated value for the next state is obtained by selecting the smallest one of the sums of the branch metrics for different possible transitions and the path metrics from the previous states.

While several paths may survive at the transition from one symbol instant to a next symbol instant, there is only one path accumulated with a minimum value. A sequence of symbol instants is referred to as a trace-back. The number of symbol instants tracing back through the trellis that extends a path with the minimum accumulated value defines the length, or decoding depth D, of a trace-back. The individual state in the trellis associated with the minimum accumulated value in a trace-back is translated into most likely bits to have been transmitted in that symbol instant. The bits are referred to as a decoded symbol.

Figure 1:
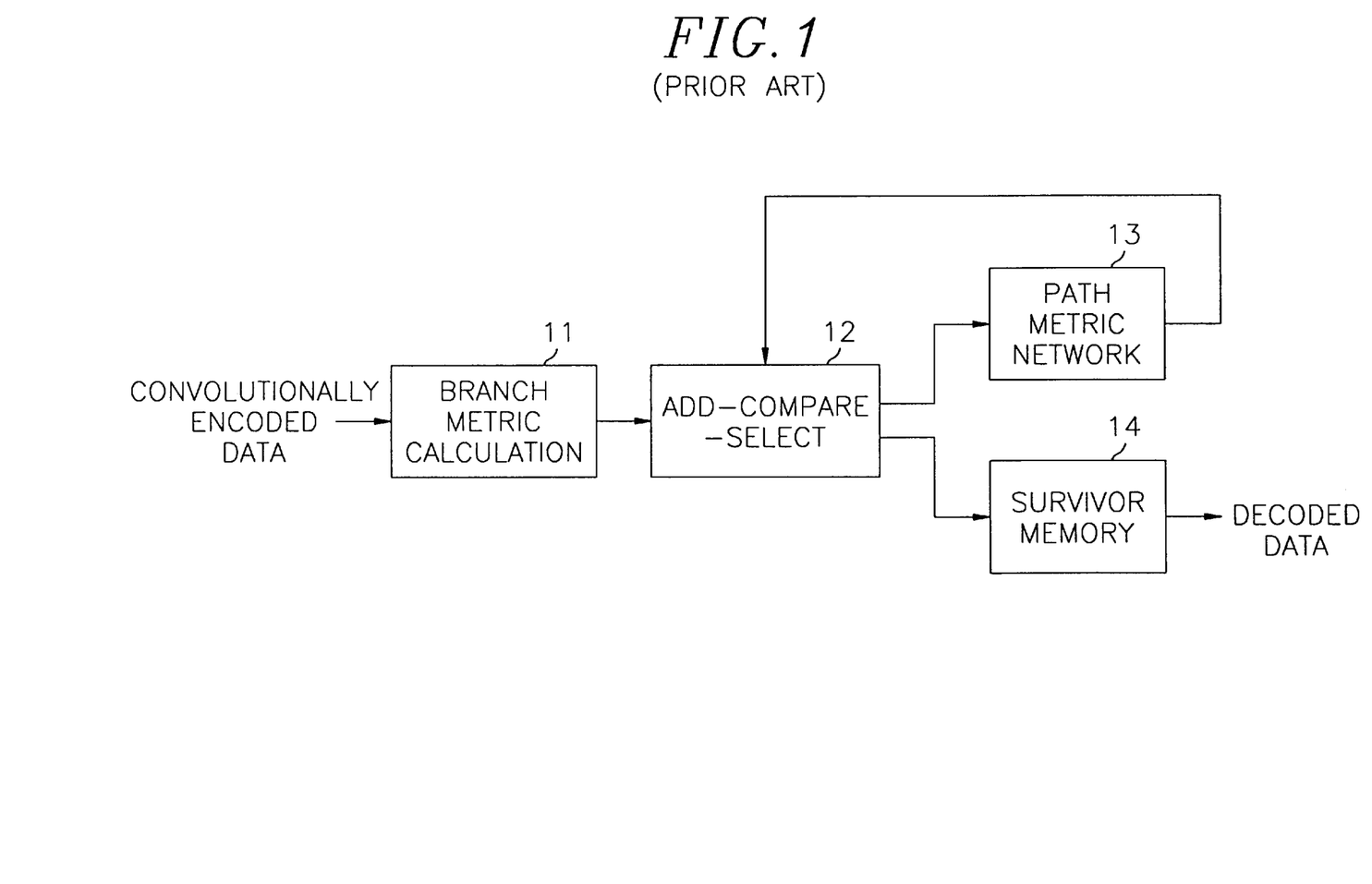
FIG. 1 shows a conventional trellis decoder employing a Viterbi algorithm.

Referring to FIG. 1, there is shown a schematic block diagram of a conventional trellis decoder including a branch metric calculation unit(BMU) 11, an add-compare-select unit(ACS) 12, a path metric network(PMN) 13, and a survivor memory unit(SMU) 14.

The branch metric calculation unit 11 receives convolutionally encoded data and calculates a distance between a path associated with each state and the received data. The calculated branch metrics corresponding to the received data are provided to the add-compare-select unit 12. The add-compare-select unit 12 chooses a path having a minimum path metric among paths corresponding to the states. The add-compare-select unit 12 adds the branch metrics provided from the branch metric calculation unit 11 to a previous path metric from the path metric network 13; and compares the sums of the branch metrics and the previous path metric with one another to thereby choose a new path metric having a smallest value. The selected path metric is provided to the path metric network 13 as a new path metric and information for tracing back on the selected path is coupled to the survivor memory unit 14. The survivor memory unit 14 stores the information from the add-compare-select unit 12 until the length of a survivor path, i.e., a decoding depth is traced back in order to decode the received symbols and provides decoded data by tracing back to the survivor path based on a trace-back algorithm.

One example of trellis decoders having the above structure is a decoder used in a GA HDTV receiving system proposed by a Grand Alliance(GA).

Figure 2:
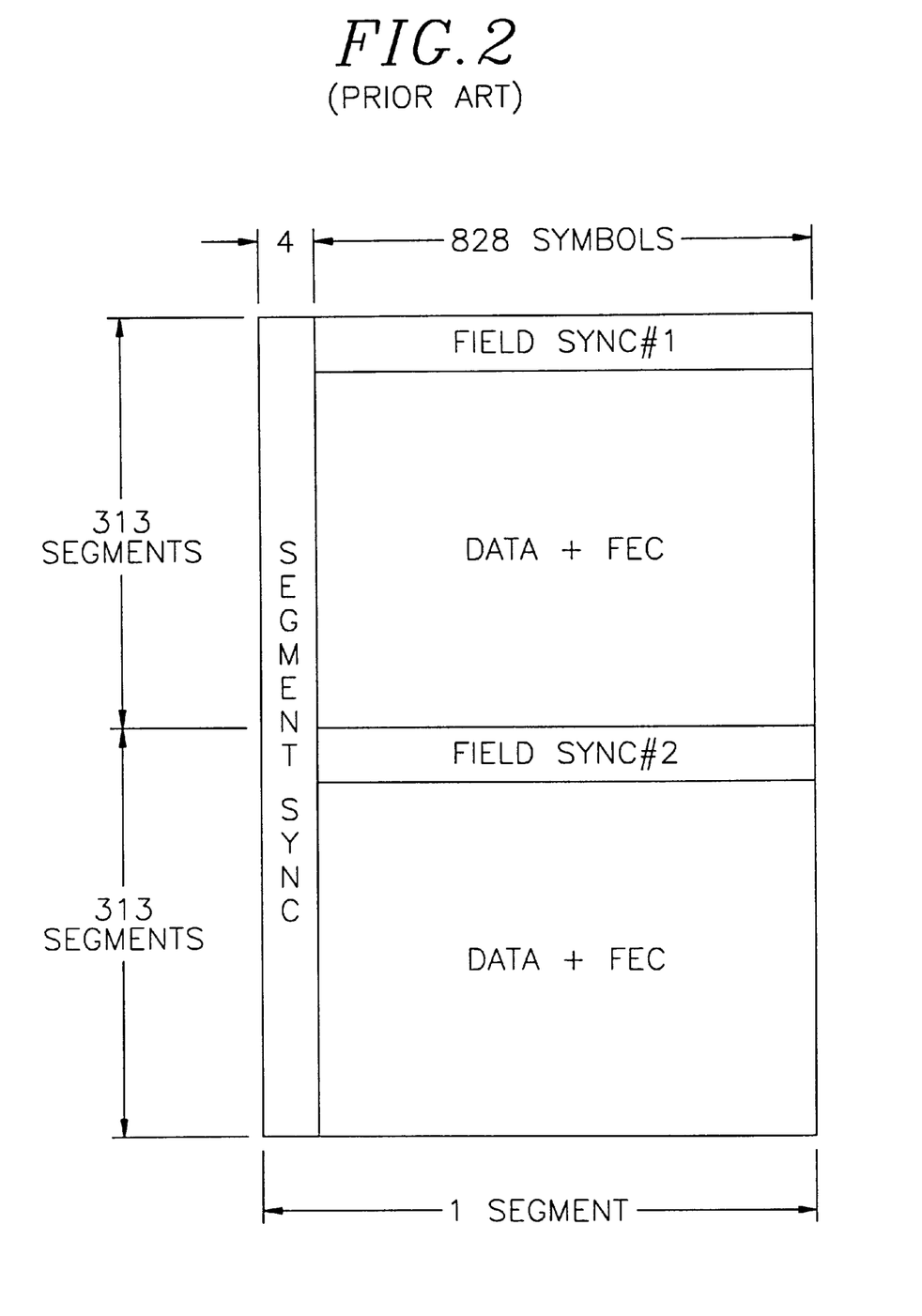
FIG. 2 illustrates a data frame structure used in a GA HDTV transmission system.

The GA HDTV transmission system encodes data in an 8-level VSB mode and transmits the coded data on a frame-by-frame basis. Referring to FIG. 2 representing a data frame structure used in the GA HDTV transmission system, a frame consists of two fields and a field is divided into 313 segments. Each segment includes a segment synchronous signal of 4 symbols and 828 (data+error correction symbol (FEC))'s and a first segment of each field is allotted to a field synchronous signal.

In order to produce a transmission signal, a randomized signal is coded by using Reed-Solomon coding; interleaved; and trellis-coded. The coded signal is cooperated with the segment synchronous and the field synchronous signals and the cooperated signal is combined with a pilot signal. The combined signal is modulated through the VSB and transmitted by a carrier.

Figure 3:
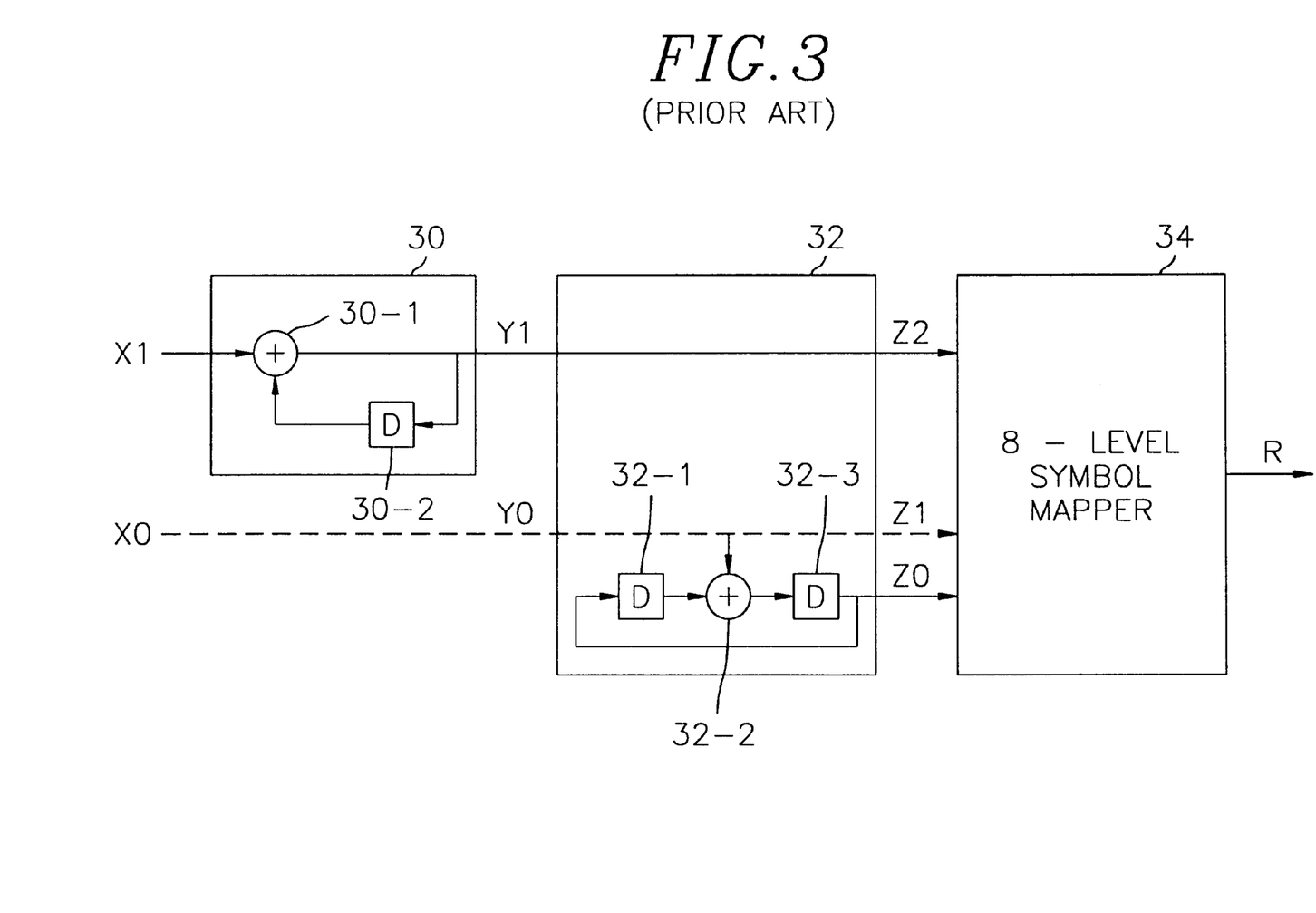
FIG. 3 provides a block diagram of an 8-level convolutional coding block used in the GA HDTV transmission system.

Referring to FIG. 3, there is provided an 8-level convolutional coding block including a pre-coder 30, a trellis encoder 32, and an 8-level symbol mapper 34.

An upper input bit X1 is exclusive-ORed with a 12 symbol delayed previous bit at the pre-coder 30 and then outputted as a middle output bit Y1. The middle output bit Y1 is directly inputted to the 8-level symbol mapper 34 as an input bit Z2 without being coded at the trellis encoder 32. A lower input bit X0 is convolutionally encoded in a coding rate of ½ at the trellis encoder 32 and then outputted as input bits Z1 and Z0 to the 8-level symbol mapper 34. The input bits Z2, Z1 and Z0 produced at the trellis coding block of a coding rate ⅔ are converted to 8-level symbols(R: −7, −5, −3, −1, 1, 3, 5, 7) at the 8-level symbol mapper 34 to thereby provide an 8-level VSB modulation signal to be transmitted.

In the meantime, the trellis coding has a strong characteristic to the AWGN but a weak characteristic to a group error. Therefore, as can be shown in FIG. 4, input symbols which are processed by a 12 symbol intrasegment interleaving are inputted to 12 number of the trellis coding blocks which are connected in parallel.

Figure 4:
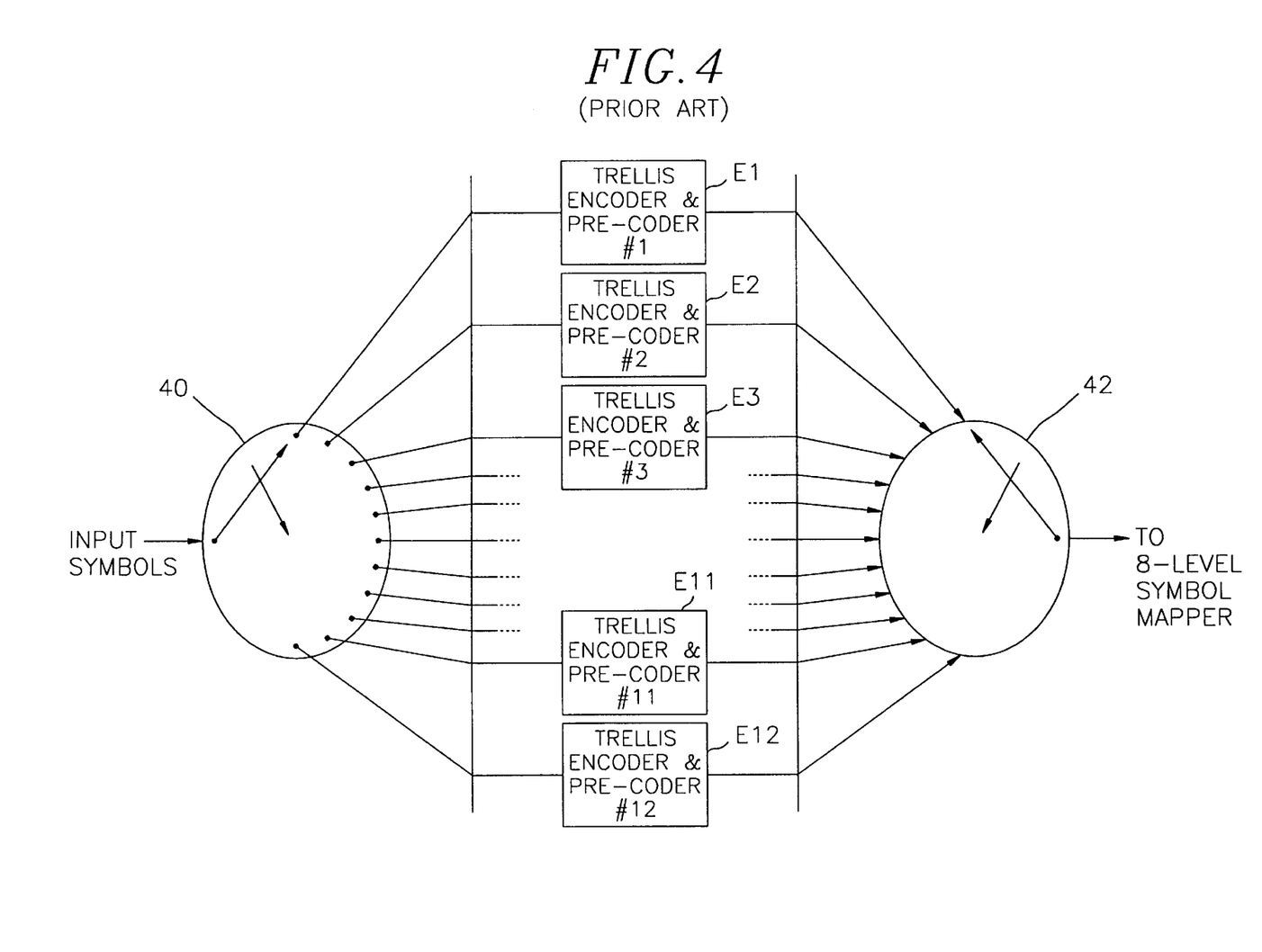
FIG. 4 depicts a trellis code interleaver for implementing a segment interleaving by using the coding block in FIG. 3.

Referring to FIG. 4, a trellis code interleaver comprises an input switch 40 which outputs interleaved data on a symbol-by-symbol basis, each symbol having two bits, i.e., X1 and X0, 12 number of trellis coding blocks E1 to E12 sequentially receiving the outputs of the input switch 40, each trellis coding block which contains the pre-coder 30 and the trellis encoder 32 as shown in FIG. 3, and an output switch 42 which receives the outputs of the trellis coding blocks E1 to E12 and transfers the received data to the 8-level symbol mapper 34. It is noted that the input switch 40 and the output switch 42 are synchronized with each other.

Figure 5:
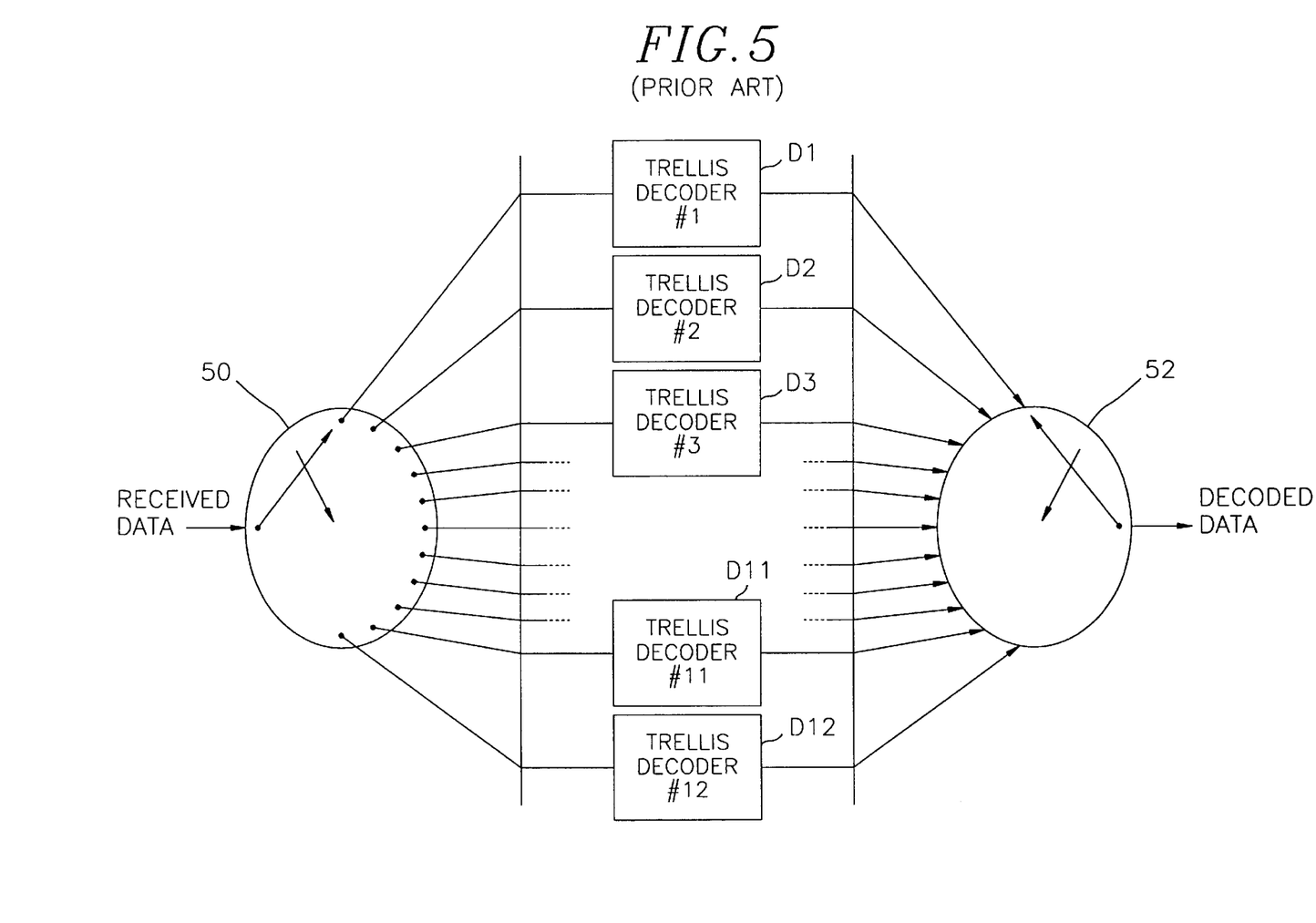
FIG. 5 presents a block diagram of a trellis code deinterleaver in the GA HDTV transmission system.

In FIG. 5, there is provided a block diagram of a trellis code deinterleaver in a GA HDTV receiving system. Since TCM codes have been interleaved by a unit of 12 symbols at the trellis code interleaver, the trellis code deinterleaver also involves 12 number of trellis decoders D1 to D12 connected in parallel in order to deinterleave the received data. Accordingly, each of the trellis decoders decodes one of 12 symbols sequentially inputted.

Figure 6:
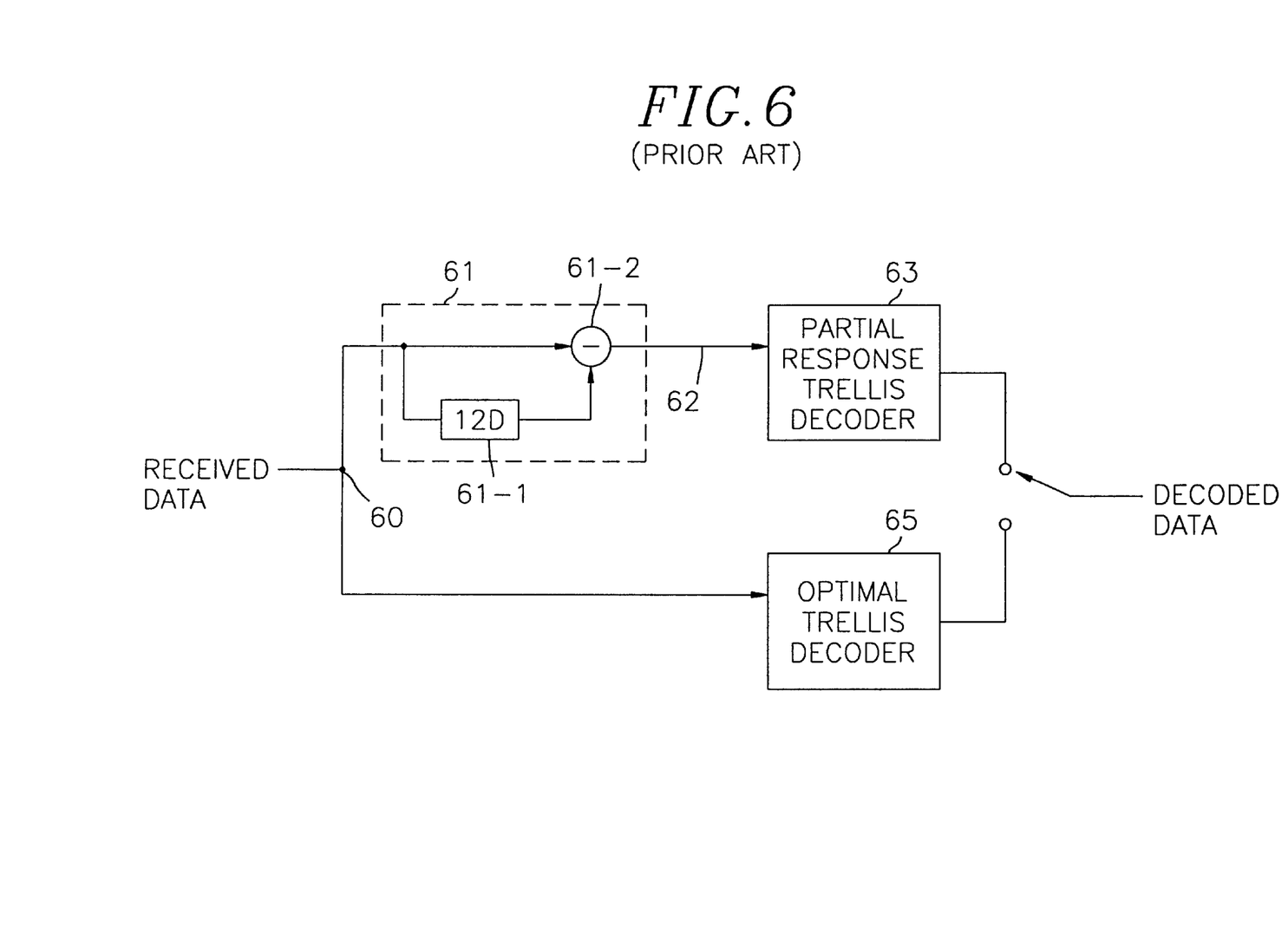
FIG. 6 is a block diagram of a trellis decoder employing a NTSC interference rejection filter.

The TCM decoding path has two different paths depending on whether an NTSC interference rejection filter is used or not as shown in FIG. 6. Referring to FIG. 6, in case the NTSC interference rejection filter is not used, an optimal trellis decoder 65 which performs 8-state mode decoding for an AWGN channel is only utilized in order to restore the received data. On the other hand, in the event the NTSC interference rejection filter 61 is used, the level of the output of the filter 61 is changed from 8 to 15 levels according to the transfer function of the filter and, therefore, a partial response trellis decoder 63 which performs 16-state mode decoding should be utilized.

As can be seen above, the conventional trellis decoder contains the 8-state mode optimal trellis decoder 65 and the 16-state mode partial response trellis decoder 63, respectively, depending on whether the NTSC interference rejection filter 61 is used or not. Therefore, there is a problem that an area occupied by the conventional trellis decoder increases.

However, in case of the conventional trellis decoder, only one of the 12 number of trellis decoders works at a time while the rest of trellis decoders do not. Therefore, one decoder can be commonly used by timely dividing it since the 12 number of trellis decoders do not work simultaneously.

In order to achieve the commonly used decoder, it is desirable to provide an apparatus for deinterleaving the 12 symbol intrasegment interleaved data and outputting deinterleaved data in an appropriate form. That is, since the received data is processed on a unit of two bits at the trellis decoder and other external devices process data on a unit of 8 bits, the bit size of the processing data needs to be changed when the data is provided to the external devices from the trellis decoder.

SUMMARY OF THE INVENTION

It is, therefore, a primary object of the present invention to provide an apparatus capable of deinterleaving decoded symbols and outputting the deinterleaved data in an appropriate bit size.

In accordance with the present invention, there is provided an apparatus, for use in a trellis decoder, for deinterleaving decoded symbols produced by decoding convolutionally encoded symbols which have been M symbol interleaved, and providing output data of P bits based on the deinterleaved decoded symbols, wherein each symbol contains K bits, M, K and P being positive integers, respectively, which comprises: two memory groups for sequentially storing the decoded symbols in response to enable signals and producing the output data of P bits based on the stored decoded symbols, wherein the two memory groups alternately achieve the storing and the producing processes; an input control block for producing the enable signals to control the two memory groups to thereby sequentially store the decoded symbols to the two memory groups; and an output control block for selecting one of outputs provided from the two memory groups and providing the selected output as the output data of P bits.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The present invention exemplarily shows a trellis decoder fitted for the GA HDTV transmission standard. The GA HDTV transmission standard implements an intersegment interleaving and an intrasegment interleaving in order to prevent data from being corrupted by a group error thereof. The intersegment interleaving is performed in ⅓ depth of a data frame on a byte-by-byte basis by an external interleaver prior to a trellis encoding. The intrasegment interleaving is implemented at intervals of 12 symbols through the use of 12 number of trellis encoders as shown in FIG. 4.

Therefore, at a receiving end, received data containing a plurality of symbols should be decoded and, at the same time, intrasegment deinterleaved by a trellis decoder. Since the trellis decoder processes the received data on a symbol-by-symbol basis, each symbol containing two bits, and an external deinterleaver processes data on the byte-by-byte basis, one byte consisting of 8 bits, the trellis decoder receives decoded symbols from the survivor memory unit on the symbol-by-symbol basis; intrasegment deinterleaves the received symbols; and outputs the deinterleaved data on the byte-by-byte basis. To be more specific, one byte data is outputted at every 4 clocks and the intrasegment deinterleaving is accomplished in an inverse manner of the intra-segment interleaving.

Figure 7:
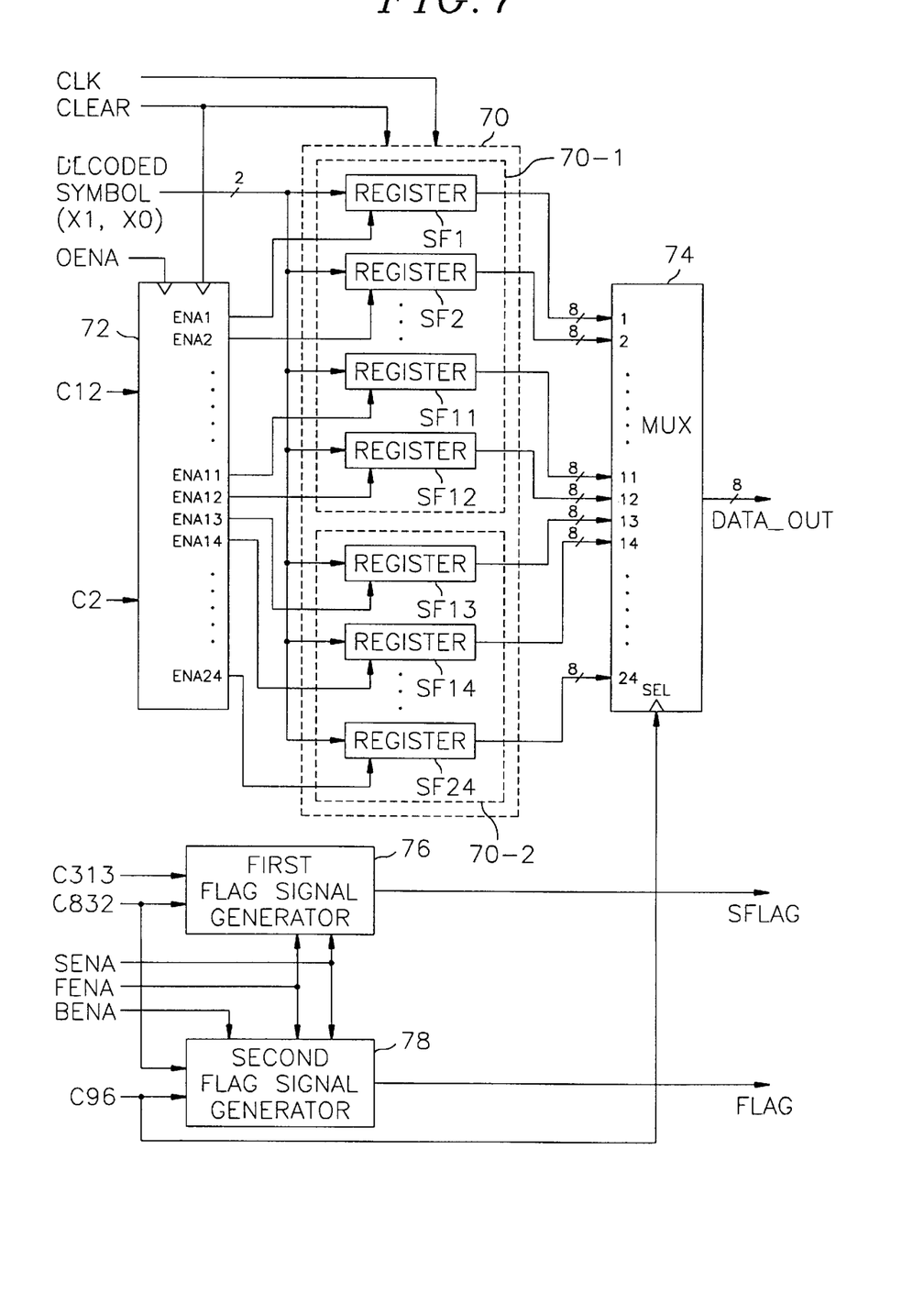
FIG. 7 represents a block diagram of a data deinterleaving and output-processing apparatus in accordance with the present invention.

Referring to FIG. 7, there is provided a schematic block diagram of a data deinterleaving and output-processing apparatus for being used in the trellis decoder in accordance with the present invention. The above apparatus basically comprises a data storage block 70, an input control block 72, an output control block 74, a first flag signal generator 76 and a second flag signal generator 78.

The data storage block 70 includes two memory groups, a first memory group 70-1 and a second memory group 70-2 and each memory group contains 12 number of 8 bit serial-input-parallel-output shift registers, SF1 to SF12 in the first memory group 70-1 and SF13 to SF24 in the second memory group 70-2. The data storage block 70 receives decoded symbols provided from the survivor memory unit (not shown) of the trellis decoder; stores them therein; and outputs them on the byte-by-byte basis.

The input control block 72 generates enable control signals ENA1 to ENA24 which are used to enable the respective shift registers SF1 to SF24 based on a counting signal C12, a counting signal C2, and an output enable signal OENA, thereby performing the deinterleaving process.

The output control block 74 selects one of 24 number of registers SF1 to SF24 in the data storage block 70 in response to a counting signal C96 and reads out the data stored in the selected register to thereby output it as an output data DATA_OUT.

In the above, the counting signal C12 is generated by a 12 counter(not shown) counting 0, 1, 2, . . . , 11 in a cycle of 12 clocks and determines which register in each memory group of the data storage block 70 is permitted to store the decoded symbol provided from the survivor memory unit. The 12 counter starts to count at the moment valid data is inputted to the data deinterleaving and output-processing apparatus. In response to the counting signal C12, every decoded symbol is sequentially coupled to one of the registers in the first memory group 70-1 or the second memory group 70-2.

The counting signal C2 is generated by a binary counter (not shown) counting 0, 1 at every 49 clocks in a cycle of 96 clocks and one of memory groups in the data storage block 70 is selected in response to the counting signal C2. By using the counting signal C2, one memory group can store the decoded symbols therein continuously while the other memory group provides the output data DATA_OUT.

The output enable signal OENA is a control signal to enable the data deinterleaving and output-processing apparatus when the valid data is inputted to the apparatus.

The counting signal C96 is produced by a 96 counter(not shown) counting 0 to 95 in a cycle of 96 clocks and determines which register in each memory group of the data storage block 70 is permitted to output the data stored therein. The 96 counter starts to count when the data deinterleaving and output-processing apparatus firstly outputs the output data. In response to the counting signal C96, one register is selected at every 4 clocks to thereby output the one byte data stored therein as the output data DATA_OUT. The 96 counter can stop to count, if necessary, when a segment synchronous signal is provided.

A data storing process of the data storage block 70 will be illustrated hereinafter.

It is assumed that the first memory group 70-1 starts to store data prior to the second memory group 70-2. ccordingly, the shift registers SF1 to SF12 are enabled in response to the respective enable signals ENA1 to ENA12. The enable signals ENA1 to ENA12 are sequentially generated in a cycle of 12 clocks and the register, in the first memory group 70-1, corresponding to each of the enable signals stores decoded symbol data responsive to the above generated enable signal. After each of the enable signals is generated four times, i.e., 48 clocks occurs, all of the registers in the one memory group can store valid data of one byte therein, respectively. Once all of the registers SF1 to SF12 in the first memory group 70-1 store valid data therein, the enable signals ENA13 to ENA24 are sequentially generated in a cycle of 12 clocks and the register corresponding to each of the enable signals ENA13 to ENA24 stores decoded symbol data therein during 48 clocks. As a result of the above process, the decoded symbol data stored in each of the registers in the first and the second memory groups 70-1 and 70-2 can be outputted as the deinterleaved one byte data.

In order to illustrate the deinterleaving process, an intra-segment interleaved data stream is represented on a unit of segments as shown in [Table 1].

TABLE 1

| No. of segment | Group 1 | Group 2 | . . . | Group 69 |
|---|---|---|---|---|
| 1 | d1, d2, d3, . . . , d12 | d1, d2, d3, . . . , d12 | . . . | d1, d2, d3, . . . , d12 |
| 2 | d5, d6, d7, . . . , d4 | d5, d6, d7, . . . , d4 | . . . | d5, d6, d7, . . . , d4 |
| 3 | d9, d10, d11, . . . , d8 | d9, d10, d11, . . . , d8 | . . . | d9, d10, d11, . . . , d8 |

In [Table 1], each group is classified on a unit of 12 symbols since the data stream is intrasegment interleaved on the unit of 12 symbols, wherein an index attached to each of the symbols is identical to the index of each of the trellis coding blocks shown in FIG. 4. That is, d1 represents a symbol outputted from the first trellis coding block E1 and d2 depicts a symbol outputted from the second trellis coding block E2. The data stream outputted from the trellis coding blocks is repeated in a cycle of 3 segments. For example, a segment 2 is sequentially outputted in an order starting from the symbol d5 outputted from the fifth trellis coding block E5 and a segment 3 is sequentially outputted in an order starting from the symbol d9 outputted from the ninth trellis coding block E9.

Likewise in the trellis coding block, the data stream which is restored on the symbol-by-symbol basis through the use of a TCM decoder in the order shown in [Table 1] is deinterleaved at the data storage block in FIG. 7 and outputted on the byte-by-byte basis. For instance, once the data stream corresponding to the segment 1 is coupled from the survivor memory unit to the data deinterleaving and output-processing apparatus in FIG. 7, the first register SF1 stores d1, d1, d1, d1 and the second register SF2 stores d2, d2, d2, d2, and so on. Therefore, the symbols encoded at the same encoder are stored at the same register to thereby form the one byte data to be outputted.

According to the above process, the enable signals ENA1 to ENA24 have disabled states, i.e., logic low levels since all of the registers should be disabled when the first segment 0, containing a segment synchronous signal and a field synchronous signal for each frame, is inputted to the data deinterleaving and output-processing apparatus. For 4 clocks during which the segment synchronous signal for each of the second to the last segments 1 to 312 of each field is inputted, the binary counter stops to count while the 12 counter does not stop to count, wherein the segments 1 to 312 contain valid data therein, since the interleaver continues to switch while the segment synchronous signals being inputted and the 12 counter has to produce one enable signal in a cycle of 12 clocks.

After 48 clocks, i.e., if one of the memory groups in the data storage block 70 is filled with decoded symbols and the other memory group starts to store decoded symbols, the symbols in the memory group filled with the decoded symbols start to be outputted from their corresponding registers. That is, each of the registers in the data storage block 70 receives the decoded symbols in series and outputs them in parallel.

The outputs of the registers in the data storage block 70 are fed to the output control block 74 in parallel and the output control block 74 selects one of the outputs of the registers at every 4 clocks to thereby output it as the output data DATA_OUT. The output control block 74 employs a 24 input multiplexer(MUX 24:1) and its selection control signal SEL is generated based on the counting signal C96 from the 96 counter. The data output process is implemented by selecting one of the 24 number of registers in the data storage block 70 at every 4 clocks in response to the counting signal C96. For example, at the moment the decoded symbol is stored at the second register in the second memory group 70-2, the symbols stored in the first memory group 70-1 start to be outputted since the data storage process to the registers stops while the segment synchronous signal being inputted, i.e., for 4 clocks.

The 4 clocks during which the data storage process is stopped are compensated while the segment synchronous signal being directly outputted without the deinterleaving. For this reason, the 96 counter stops to count not while the segment synchronous signal being inputted but during the 4 clocks in which a next segment synchronous signal is outputted after all of the valid data are outputted. It is noted that the 96 counter should start to count at the moment the first decoded symbol for each field is outputted from the survivor memory unit.

Meanwhile, the TCM decoder needs flag signal generators in order to give information for present output data to the external devices, e.g., the deinterleaver performing the intersegment deinterleaving or a Reed Solomon decoder.

The first flag signal generator 76 generates a SFLAG signal representing whether the segment synchronous signal is outputted or not based on a system enable signal SENA, a mode selection signal FENA, a counting signal C832 counting the segment length 832, and a counting signal C313 counting the field length 313. The SFLAG signal has a logic high level, i.e., a digit 1, while the segment synchronous signal for each segment being outputted and has a logic low level, i.e., a digit 0, during the rest of the time.

The second flag signal generator 78 produces a FLAG signal representing whether the valid data is outputted or not based on the system enable signal SENA, the mode selection signal FENA, a control signal BENA, the counting signal C832, and the counting signal C96. The FLAG signal has a logic high level, e.g., a digit 1 only if the valid data is outputted from the survivor memory unit.

The control signal BENA is a control signal preventing the FLAG signal from being changed to a logic high level before the valid data for the first field is outputted. Therefore, the control signal BENA should be generated by reflecting a processing time, e.g., the traceback time in the survivor memory unit, spent before the valid data is outputted from the survivor memory unit.

In the above, although the FLAG signal has a logic high level during the first clock of the 4 clocks in which each of the segment synchronous signals of the rest segments except that of the first segment in each field is outputted, the valid data is not outputted at that time.

The present invention can be adopted to a decoder employing an interleaving and deinterleaving process such as a trellis decoder and a Viterbi decoder and can be used in converting the size of data in case that the number of input bits and the number of output bits thereof are not identical to each other.

As can be seen above, the data deinterleaving and output-processing apparatus in accordance with the present invention intrasegment deinterleaves the decoded symbols, each symbol having two bits; converts them to 8 bit data; and outputs the converted data. Also, the present apparatus provides the flag signals representing the information for the present output data outputted from the TCM decoder by considering the synchronous signals. Accordingly, the external devices can effectively use the decoded data outputted from the TCM decoder.

While the present invention has been described with respect to the particular embodiments, it will be apparent to those skilled in the art that various changes and modifications may be made without departing from the spirit and scope of the invention as defined in the following claims.

What is claimed is:

1. An apparatus, for use in a trellis decoder, for deinterleaving decoded symbols produced by decoding convolutionally encoded symbols which have been M symbol interleaved, and providing output data of P bits based on the deinterleaved decoded symbols, wherein each symbol contains K bits, M, K and P being positive integers, respectively, which comprises:

two memory groups for sequentially storing the decoded symbols in response to enable signals and producing the output data of P bits based on the stored decoded symbols, wherein the two memory groups alternately perform the storing and the producing processes;

input control means for producing the enable signals to control the two memory groups to thereby sequentially store the decoded symbols to the two memory groups; and output control means for selecting one of outputs provided from the two memory groups and providing the selected output as the output data of P bits.

2. The apparatus as recited in claim 1, wherein P is a multiple of K.

3. The apparatus as recited in claim 2, wherein each of the two memory groups contains M number of storage units, each of the storage units fully reserving the data of P bits and sequentially operating in response to the enable signals.

4. The apparatus as recited in claim 3, wherein each of the storage units employs a serial-input-parallel-output shift register which receives the decoded symbols on a unit of K bits and outputs the stored symbols therein on a unit of P bits.

5. The apparatus as recited in claim 4, wherein the decoded symbols stored at each of the storage units correspond to the convolutionally encoded symbols which have been encoded at a same encoder.

6. The apparatus as recited in claim 1 further comprising a flag signal generator for producing flag signals representing information for the output data provided via the output control means.

7. The apparatus as recited in claim 6, wherein the flag signal generator includes:

means for producing a SFLAG signal representing whether a segment synchronous signal is outputted or not; and means for generating a FLAG signal depicting whether valid data is outputted or not.

* * * * *